(12) United States Patent  
Hori

(10) Patent No.: US 10,658,467 B2  
(45) Date of Patent: May 19, 2020

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Yoichi Hori, Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/284,012

(22) Filed: Feb. 25, 2019

(65) Prior Publication Data

US 2020/0091298 A1     Mar. 19, 2020

(30) Foreign Application Priority Data

Sep. 19, 2018 (JP) ................... 2018-175441

(51) Int. Cl.

| H01L 29/872 | (2006.01) |
|---|---|
| H01L 27/08 | (2006.01) |
| H01L 29/06 | (2006.01) |
| H01L 29/16 | (2006.01) |
| H01L 29/868 | (2006.01) |

(Continued)

(52) U.S. Cl.  
CPC ...... *H01L 29/1608* (2013.01); *H01L 29/0615* (2013.01); *H01L 29/0692* (2013.01); *H01L 29/43* (2013.01); *H01L 29/868* (2013.01); *H01L 29/41* (2013.01)

(58) Field of Classification Search  
CPC . H01L 29/0692; H01L 29/1608; H01L 29/41; H01L 29/417; H01L 29/868; H01L 29/872; Y10S 438/931  
See application file for complete search history.

(56) References Cited

U.S. PATENT DOCUMENTS

| 8,766,334 B2 * | 7/2014 | Tsuchiya ............... H01L 29/78 257/288 |
|---|---|---|
| 8,803,277 B2 | 8/2014 | Henning et al. |
| 9,385,243 B2 | 7/2016 | Hori et al. |

(Continued)

FOREIGN PATENT DOCUMENTS

| JP | 5789308 B2 | 10/2015 |
|---|---|---|
| JP | 2015-207780 A | 11/2015 |

(Continued)

*Primary Examiner* — David C Spalla  
(74) *Attorney, Agent, or Firm* — White & Case LLP

(57) ABSTRACT

A semiconductor device of an embodiment includes a silicon carbide layer having a first plane and a second plane; a first silicon carbide region of a first conductivity type in the silicon carbide layer; a second silicon carbide region of a second conductivity type between the first silicon carbide region and the first plane; a third silicon carbide region of the second conductivity type between the first silicon carbide region and the first plane, the third silicon carbide region extending in a first direction parallel to the first plane; a first electrode provided on a side of the first plane; a second electrode provided on a side of the second plane; and a metal silicide layer provided between the first electrode and the second silicon carbide region, the metal silicide layer having a portion being in contact with the first plane, and a shape of the portion being an octagon.

10 Claims, 6 Drawing Sheets

(51) Int. Cl.
*H01L 29/43* (2006.01)
*H01L 29/41* (2006.01)

(56) References Cited

U.S. PATENT DOCUMENTS

| | | | |
|---|---|---|---|
| 9,478,673 B2 | 10/2016 | Aketa et al. | |
| 9,577,046 B1* | 2/2017 | Hori | ............ H01L 29/1608 |
| 2016/0276442 A1* | 9/2016 | Oota | ............ H01L 29/1608 |
| 2017/0271528 A1* | 9/2017 | Oota | ............ H01L 27/0814 |

FOREIGN PATENT DOCUMENTS

| | | |
|---|---|---|
| JP | 2016-004965 A | 1/2016 |
| JP | 2017-55009 A | 3/2017 |
| JP | 6112600 B2 | 4/2017 |

* cited by examiner

SEMICONDUCTOR DEVICE

CROSS-REFERENCE TO RELATED APPLICATION

This application is based upon and claims the benefit of priority from Japanese Patent Application No. 2018-175441, filed on Sep. 19, 2018, the entire contents of which are incorporated herein by reference.

FIELD

Embodiments described herein relate generally to a semiconductor device.

BACKGROUND

Junction barrier schottky diode (JBS) is one kind of Schottky barrier diode (SBD). JBS has a PiN diode region provided in an active region in order to improve forward surge resistance. As the PiN diode region is provided in the active region, it is possible to cause a large forward surge current to flow by utilizing the conductivity modulation of the PiN diode region. A metal silicide layer is formed between an electrode and a p-type impurity region in order to reduce contact resistance of the PiN diode region.

DETAILED DESCRIPTION

Figure 1:
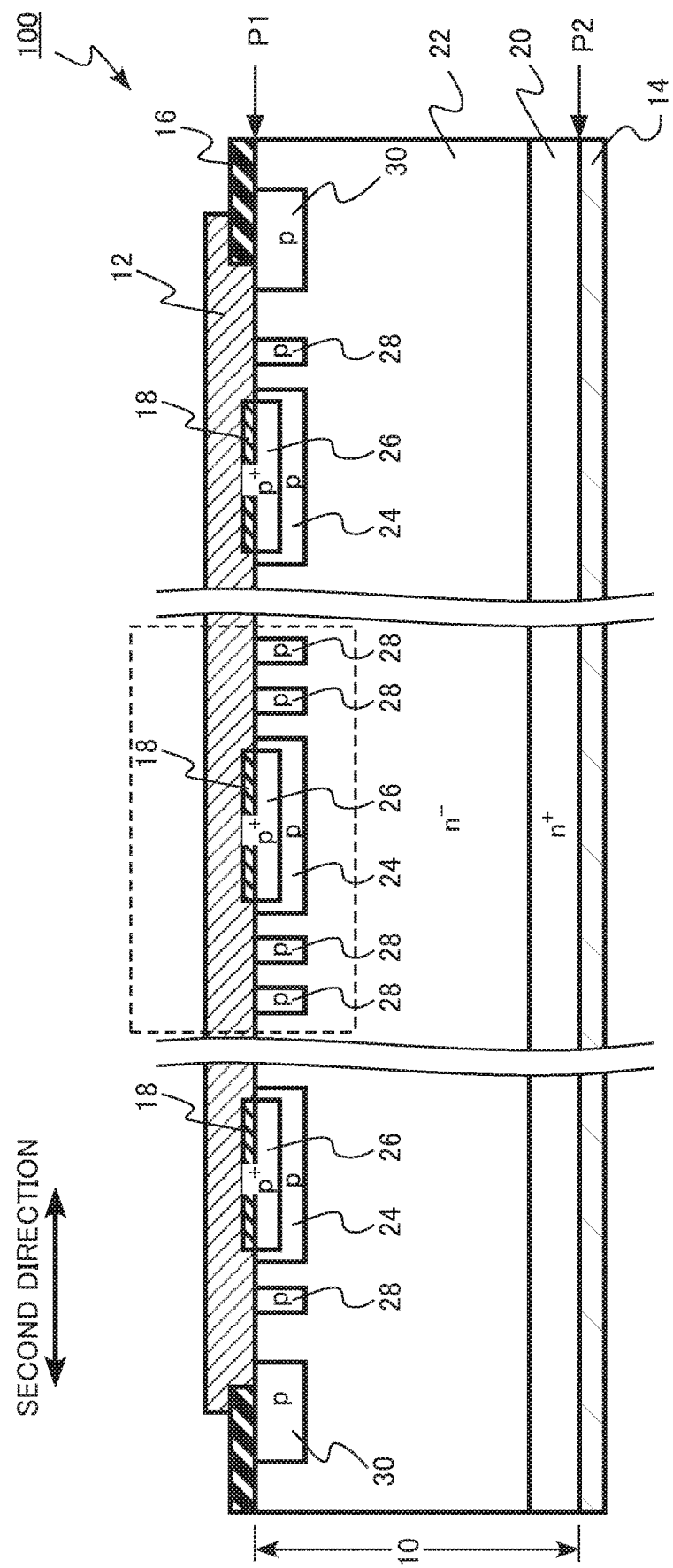
FIG. 1 is a schematic cross-sectional view of a semiconductor device of an embodiment.

Hereinafter, an embodiment of the present disclosure will be described with reference to the drawings. In the following description, the same members and the like will be denoted by the same reference numerals, and members that have been once described will not be described as appropriate.

In the following description, notations $n^+$, n, $n^-$, $p^+$, p, and $p^-$ indicate relative levels of impurity concentration in each conductivity type. That is, $n^+$ indicates an n-type impurity concentration higher than that of n, and $n^-$ indicates an n-type impurity concentration lower than that of n. In addition, $p^+$ indicates a p-type impurity concentration higher than that of p, and $p^-$ indicates a p-type impurity concentration lower than that of p. In some cases, an $n^+$-type and an $n^-$-type are simply referred to as an n-type, and a $p^+$-type and a $p^-$-type are simply referred to as a p-type.

The impurity concentration can be measured by secondary ion mass spectrometry (SIMS), for example. In addition, a relative level of the impurity concentration can also be determined based on a level of a carrier concentration obtained by, for example, scanning capacitance microscopy (SCM). In addition, a distance such as a depth of an impurity region can be obtained by SIMS, for example.

A semiconductor device of an embodiment includes: a silicon carbide layer having a first plane and a second plane facing the first plane; a first silicon carbide region of a first conductivity type provided in the silicon carbide layer; a second silicon carbide region of a second conductivity type provided between the first silicon carbide region and the first plane; a third silicon carbide region of the second conductivity type provided between the first silicon carbide region and the first plane, the third silicon carbide region extending in a first direction parallel to the first plane, the third silicon carbide region being connected to the second silicon carbide region, and the third silicon carbide region having a first width in a second direction, the second direction being parallel to the first plane and perpendicular to the first direction, the first width being narrower than a second width of the second silicon carbide region in the second direction; a first electrode provided on a side of the first plane of the silicon carbide layer and the first electrode being in contact with the first silicon carbide region; a second electrode provided on a side of the second plane of the silicon carbide layer; and a metal silicide layer provided between the first electrode and the second silicon carbide region, the metal silicide layer having a portion being in contact with the first plane, and a shape of the portion being an octagon.

Figure 2:
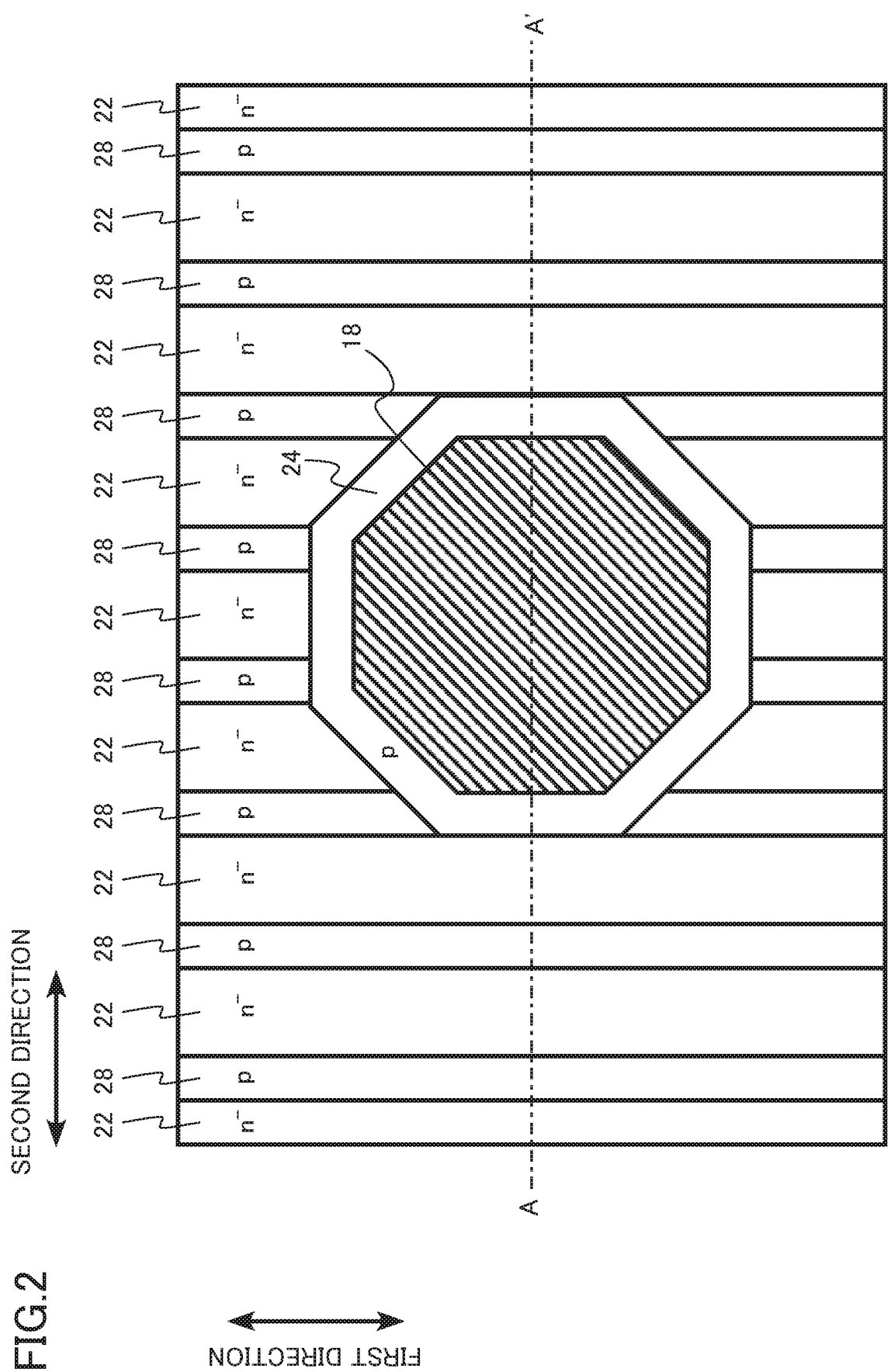
FIG. 2 is an enlarged schematic top view of the semiconductor device of the embodiment.
Figure 3:
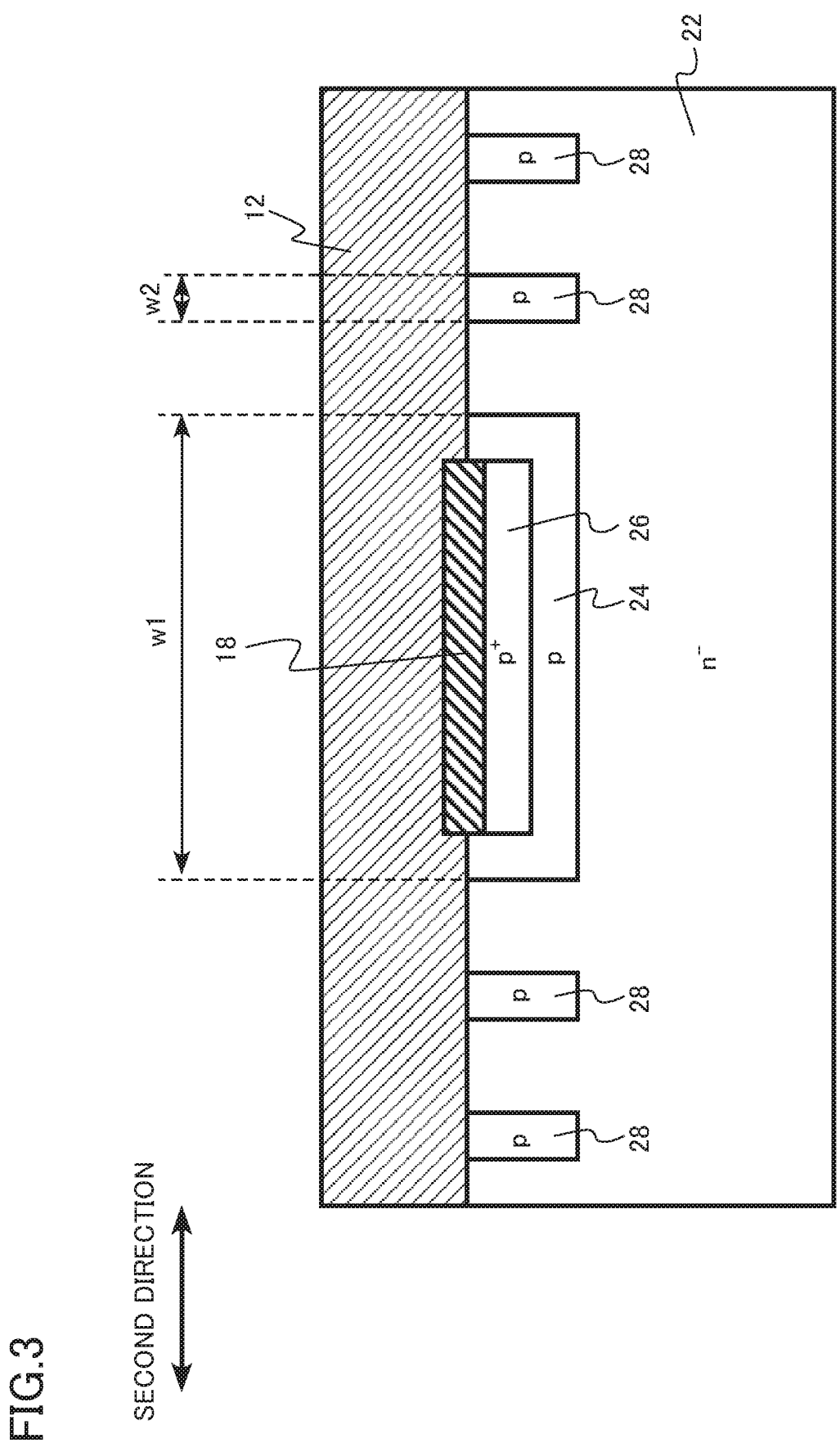
FIG. 3 is an enlarged schematic cross-sectional view of the semiconductor device of the embodiment.

FIG. 1 is a schematic cross-sectional view of a semiconductor device of an embodiment. FIG. 2 is a schematic enlarged cross-sectional view of the semiconductor device of the embodiment. FIG. 2 is an enlarged view of a dotted frame portion in FIG. 1. FIG. 3 is a schematic enlarged cross-sectional view of the semiconductor device of the embodiment. FIG. 3 corresponds to a cross-sectional view taken along a line AA' of FIG. 2.

The semiconductor device of the embodiment is a JBS 100 having a PiN diode region. Hereinafter, a case where a first conductivity type is an n type and a second conductivity type is a p type will be described as an example.

The JBS 100 includes a silicon carbide layer 10 (semiconductor layer), an anode electrode 12 (first electrode), a cathode electrode 14 (second electrode), a field oxide film 16, and a metal silicide layer 18.

In the silicon carbide layer 10, an $n^+$-type cathode region 20 (a fifth silicon carbide region), an $n^-$-type drift region 22 (a first silicon carbide region), a p-type first anode region 24 (a second silicon carbide region), a $p^+$-type second anode region 26 (a fourth silicon carbide region), a p-type region 28 (a third silicon carbide region), and a p-type RESURF region 30 are provided.

The silicon carbide layer 10 has a first plane ("P1" in FIG. 1) and a second plane ("P2" in FIG. 1). The second plane P2 facing the first plane P1. The silicon carbide layer 10 is single crystal silicon carbide (SiC). The silicon carbide layer 10 is, for example, a 4H-SiC.

A description will be given by exemplifying a case where the first plane P1 of the silicon carbide layer 10 is a plane inclined by 0° to 8° with respect to the (0001) face, and the second plane P2 is a plane inclined by 0° to 8° with respect to the (000-1) face. The (0001) face is referred to as a silicon face. The (000-1) face is referred to as a carbon face.

The $n^+$-type cathode region 20 is provided between the cathode electrode 14 and the $n^-$-type drift region 22.

The cathode region 20 contains an n-type impurity. The n-type impurity is, for example, nitrogen (N). An n-type impurity concentration of the cathode region 20 is higher than an n-type impurity concentration of the $n^-$-type drift region 22. The n-type impurity concentration is, for example, $1\times10^{18}$ $cm^{-3}$ to $1\times10^{21}$ $cm^{-3}$.

The n⁻-type drift region 22 is provided between the cathode region 20 and the first plane P1. The drift region 22 is provided on the cathode region 20. The drift region 22 functions as a region through which carriers flow. A part of the drift region 22 is in contact with the anode electrode 12 at the first plane P1.

The contact between the anode electrode 12 and the drift region 22 is Schottky contact. A region where the anode electrode 12 and the drift region 22 are in contact with each other is a Schottky region through which an on-current flows when a forward bias is applied.

The drift region 22 contains an n-type impurity. The n-type impurity is, for example, nitrogen (N). The n-type impurity concentration of the drift region 22 is, for example, $1\times10^{14}$ cm⁻³ to $2\times10^{16}$ cm⁻³. A thickness of the drift region 22 is, for example, 3 μm to 50 μm.

Incidentally, an n-type buffer layer (not illustrated) may be provided between the n⁺-type cathode region 20 and the n⁻-type drift region 22. An n-type impurity concentration of the n-type buffer layer is intermediate concentration between an impurity concentration of the n⁺-type cathode region 20 and an impurity concentration of the n⁻-type drift region 22.

The p-type first anode region 24 is provided between the drift region 22 and the first plane P1. The first anode region 24 is provided between the anode electrode 12 and the drift region 22.

The p-type first anode region 24 is provided so as to surround, for example, the p⁺-type second anode region 26.

The p-type first anode region 24 contains a p-type impurity. The p-type impurity is, for example, aluminum (Al). A p-type impurity concentration of the first anode region 24 is, for example, $1\times10^{16}$ cm⁻³ to $5\times10^{18}$ cm⁻³.

A width ("w1" in FIG. 3; second width) of the p-type first anode region 24 is, for example, 3.0 μm to 15.0 μm.

The p⁺-type second anode region 26 is provided between the first anode region 24 and the anode electrode 12. The second anode region 26 is provided between the first anode region 24 and the metal silicide layer 18. The second anode region 26 is provided in the first anode region 24.

The contact between the anode electrode 12 and the second anode region 26 is ohmic contact.

The second anode region 26 contains a p-type impurity. The p-type impurity is, for example, aluminum (Al). A p-type impurity concentration of the second anode region 26 is higher than the p-type impurity concentration of the first anode region 24. The p-type impurity concentration is, for example, $1\times10^{19}$ cm⁻³ to $1\times10^{21}$ cm⁻³.

A width of the second anode region 26 is narrower than the width w1 (second width) of the first anode region 24. The width of the second anode region 26 is, for example, 2.0 μm to 12.0 μm.

A region where the p-type first anode region 24 and the p⁺-type second anode region 26 are present is a PiN diode region. The PiN diode region causes a large amount of current to flow using conductivity modulation by hole injection when a forward surge current occurs. As a result, destruction of the JBS 100 due to heat generation or the like is suppressed.

The PiN diode region is repeatedly disposed, for example, in a first direction and a second direction.

The p-type region 28 is provided between the drift region 22 and the first plane P1. The p-type region 28 is provided between the anode electrode 12 and the drift region 22. The p-type region 28 is in contact with the anode electrode 12 at the first plane P1.

The p-type region 28 has, for example, a stripe shape as illustrated in FIG. 2. The p-type region 28 extends in the first direction parallel to the first plane P1. A part of the p-type region 28 is in contact with the first anode region 24.

The p-type region 28 has a function of suppressing a leakage current when a reverse bias is applied. A depletion layer expands in the drift region 22 between the two p-type regions 28 when the reverse bias is applied, thereby mitigating an electric field between the anode electrode 12 and the drift region 22. As a result, the leakage current of the JBS 100 is suppressed.

A width ("w2" in FIG. 3; first width) of the p-type region 28 is narrower than the width of the first anode region 24 ("w1" in FIG. 3; second width). That is, w2<w1. The width w2 of the p-type region 28 is, for example, 0.5 μm to 3.0 μm. A distance between the p-type region 28 and the p-type region 28 is, for example, 1.0 μm to 5.0 μm.

The p-type region 28 contains a p-type impurity. The p-type impurity is, for example, aluminum (Al).

A p-type impurity concentration of the p-type region 28 is lower than the p-type impurity concentration of the second anode region 26. The p-type impurity concentration of the p-type region 28 is, for example, substantially the same as the p-type impurity concentration of the first anode region 24. The p-type impurity concentration of the p-type region 28 is, for example, $5\times10^{16}$ cm⁻³ to $5\times10^{18}$ cm⁻³

The p-type RESURF region 30 is provided to surround the p-type first anode region 24 and the p-type region 28 in the first plane. The p-type RESURF region 30 is electrically connected to the anode electrode 12.

The p-type RESURF region 30 has a junction termination extension (JTE) structure so as to improve a breakdown voltage of the JBS 100.

The p-type RESURF region 30 contains a p-type impurity. The p-type impurity is, for example, aluminum (Al). A p-type impurity concentration of the RESURF region 30 is, for example, $1\times10^{16}$ cm⁻³ to $1\times10^{18}$ cm⁻³

The field oxide film 16 is provided on the p-type RESURF region 30. The field oxide film 16 is, for example, silicon oxide.

The anode electrode 12 is provided on the first plane P1 side of the silicon carbide layer 10. The anode electrode 12 is in contact with the n⁻-type drift region 22, the p-type region 28, the first anode region 24, and the metal silicide layer 18 at an opening of the field oxide film 16.

The anode electrode 12 includes metal. The anode electrode 12 is, for example, a stacked structure of titanium and aluminum.

The cathode electrode 14 is provided on the second plane P2 side of the silicon carbide layer 10. The cathode electrode 14 is provided in contact with the cathode region 20. The contact between the cathode electrode 14 and the cathode region 20 is ohmic contact.

The cathode electrode 14 is, for example, metal or a metal semiconductor compound. The cathode electrode 14 includes, for example, material selected from the group consisting of nickel silicide, titanium, nickel, silver, and gold.

The metal silicide layer 18 is provided between the anode electrode 12 and the second anode region 26. The metal silicide layer 18 is in contact with the first plane P1 of the silicon carbide layer 10.

The metal silicide layer 18 includes, for example, nickel silicide or titanium silicide. A thickness of the metal silicide layer 18 is, for example, 50 nm to 300 nm.

The contact between the anode electrode 12 and the second anode region 26 becomes ohmic contact by providing the metal silicide layer 18.

A shape of a portion of the metal silicide layer 18 in contact with the first plane P1 is an octagon as illustrated in FIG. 2. The octagon is a polygon with eight sides. The shape of the portion of the metal silicide layer 18 in contact with the first plane P1 is, for example, a regular octagon.

At least one side among eight sides of the octagon of the metal silicide layer 18 is parallel to the first direction. Among the eight sides of the octagon of the metal silicide layer 18, for example, two sides are parallel to the first direction and two sides are parallel to the second direction.

Next, a function and an effect of the JBS 100 of the embodiment will be described.

The JBS 100 of the embodiment can cause a large forward surge current to flow using the conductivity modulation of the PiN diode region by providing the PiN diode region. Further, a part of the p-type region 28 is in contact with the p-type first anode region 24. Since the p-type region 28 is in contact with the first anode region 24 of the PiN diode region, holes are propagated from the PiN diode region to the p-type region 28 and holes are injected even in the narrow p-type region 28 when the forward surge current occurs. Therefore, it is possible to disperse the hole injection over a wide range of an element region. Thus, it is possible to disperse a heat generation region and to further improve forward surge resistance.

It is necessary to reduce contact resistance in the PiN diode region in order to allow a large current to flow. The metal silicide layer 18 is formed between the anode electrode 12 and the p$^+$-type second anode region 26 in order to reduce the contact resistance.

For example, a bonding wire is formed on the anode electrode 12 at the time of mounting the JBS 100. There is a case where cracks are generated in the silicon carbide layer 10 at a pattern edge of the metal silicide layer 18 due to a load at the time of forming the bonding wire. The cracks will increase a reverse leakage current of the JBS 100.

The cracks tend to occur at corners of a polygonal pattern of the metal silicide layer 18. It is considered that this is because stress tends to concentrate on the corner of the polygonal pattern.

The shape of the portion of the metal silicide layer 18 in contact with the first plane P1 is the octagon in the JBS 100 of the embodiment. The octagon has a larger apex angle than a triangle, a square, or a hexagon, for example.

When the apex angle is small, that is, when the corner is sharp, it is considered that stress tends to concentrate on the corner and cracks are likely to occur.

Therefore, the stress at the pattern edge of the metal silicide layer 18 is mitigated, and the occurrence of cracks is suppressed in the JBS 100 of the embodiment.

Therefore, the leakage current is suppressed, and JBS 100 with excellent reverse leakage current characteristics is realized.

Further, the characteristics of the JBS 100 are stabilized by applying the octagonal pattern to the metal silicide layer 18.

Figure 4:
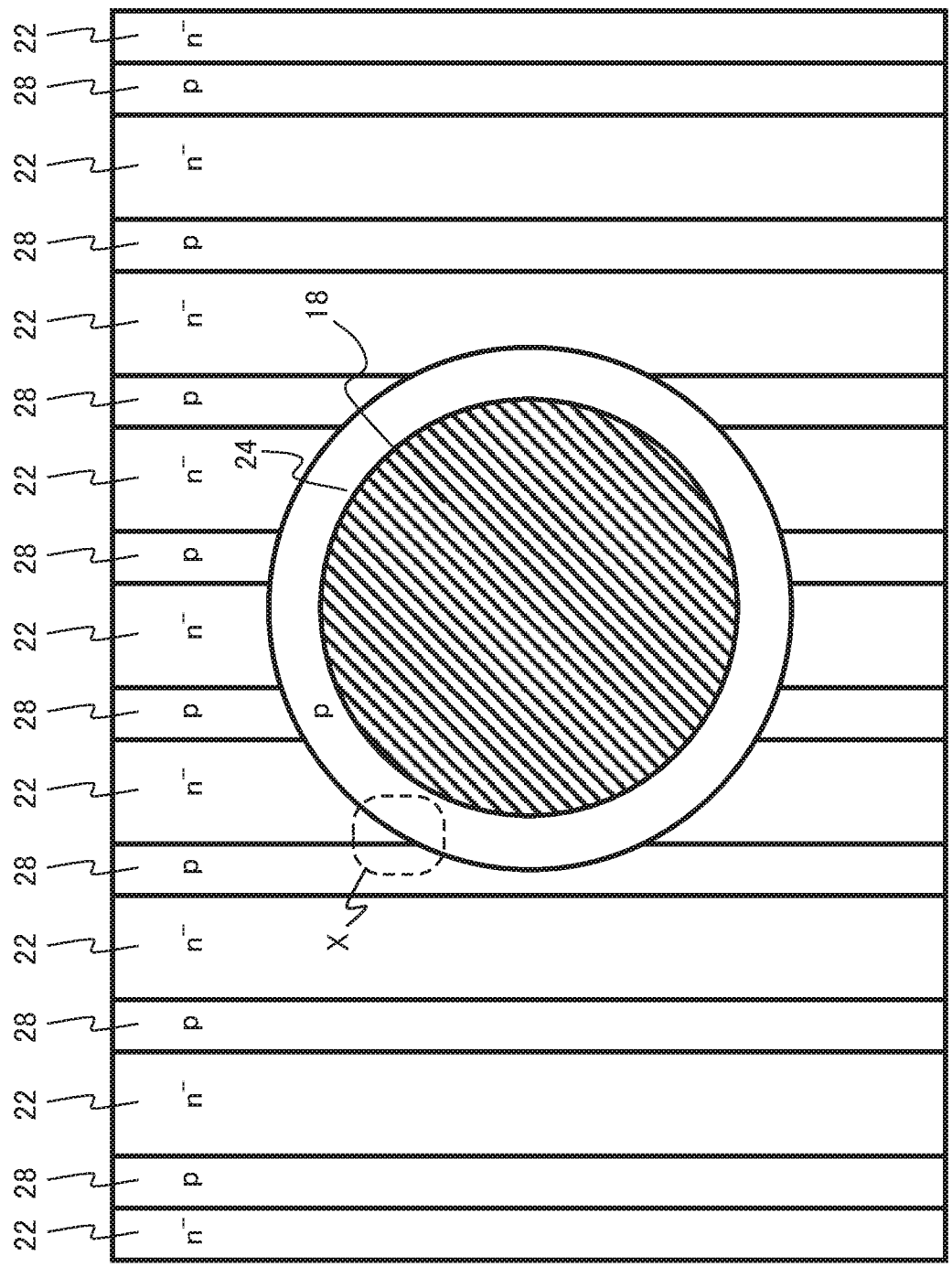
FIG. 4 is an explanatory view of the function and effect of the semiconductor device of the embodiment.
Figure 5:
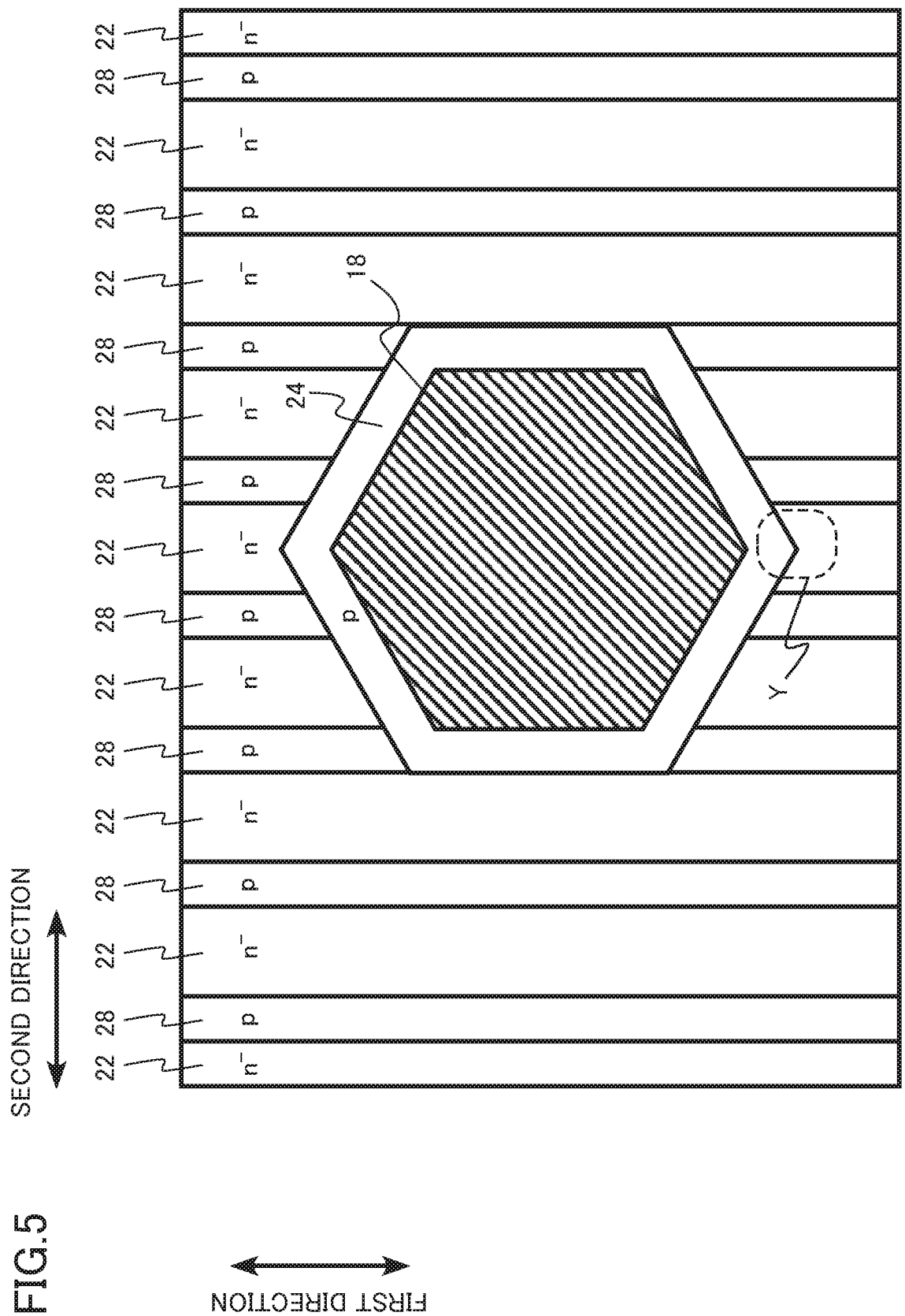
FIG. 5 is an explanatory view of the function and effect of the semiconductor device of the embodiment.
Figure 6:
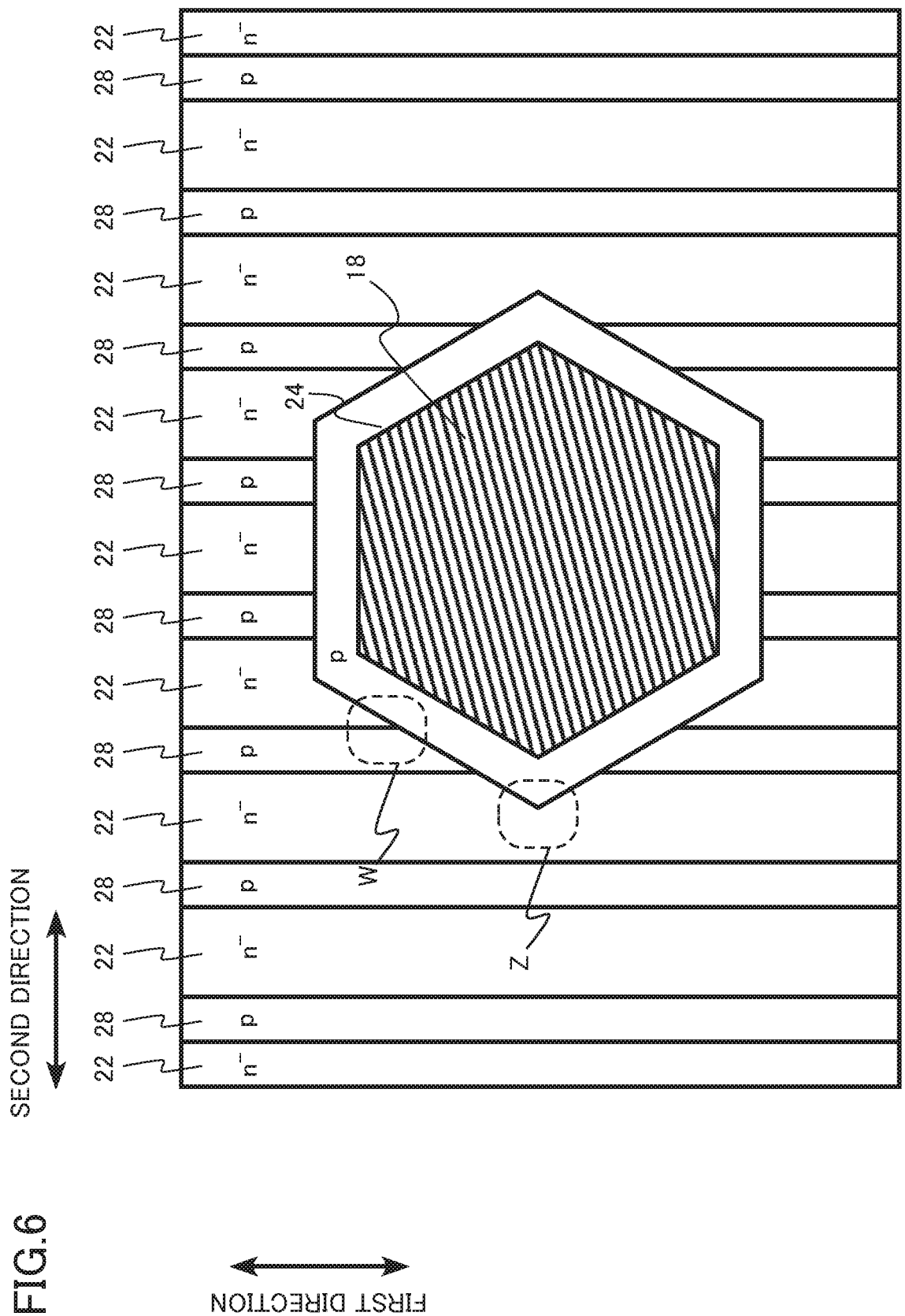
FIG. 6 is an explanatory view of the function and effect of the semiconductor device of the embodiment.

FIGS. 4, 5, and 6 are explanatory views of the function and the effect of the semiconductor device of the embodiment. FIGS. 4, 5, and 6 are schematic top views of a JBS of a comparative example.

FIG. 4 illustrates a case where a metal silicide layer is circular, and FIGS. 5 and 6 illustrate a case where a metal silicide layer is hexagonal.

FIG. 4 is a view illustrating a case where, for example, the first anode region 24 and the metal silicide layer 18 are shifted in the second direction with respect to the p-type region 28 due to misalignment. In this case, there is a risk that region where a pn junction has an acute angle may appear for example, as in a region X. If the pn junction has the acute angle as in the region X, this point becomes a singular point so that there is a risk that, for example, a reverse leakage current increases or a breakdown voltage decreases.

In addition, when a hexagonal pattern of the metal silicide layer 18 is disposed as illustrated in FIG. 5, a sharp region of a p region appears as in a region Y. Even in this case, there is a risk that, for example, the reverse leakage current increases or the breakdown voltage decreases.

In addition, when the hexagonal pattern of the metal silicide layer 18 is disposed to be rotated by 30 degrees from FIG. 5 as illustrated in FIG. 6, a region where a p-type region is sharp as in a region Z appears or a region where a pn junction has an acute angle appears as in a region W. Even in this case, there is a risk that, for example, the reverse leakage current increases or the breakdown voltage decreases.

In the octagonal pattern of the metal silicide layer 18 of the JBS 100 of the embodiment, a singular point hardly appears in the shape of the pn junction in relation with a stripe-shaped pattern of the p-type region 28. A pn junction having an acute angle hardly appears even the patterns are shifted, for example. Therefore, for example, the increase in reverse leakage current and the decrease in breakdown voltage hardly occur, and the characteristics of JBS 100 are stabilized.

It is preferable that at least one side among eight sides of the octagon of the metal silicide layer 18 is parallel to the first direction. And, it is more preferable that among the eight sides of the octagon of the metal silicide layer 18, two sides are parallel to the first direction and two sides are parallel to the second direction. With the above configurations, a pn junction which has an acute angle less likely to appear.

From the view point of easier pattern design, it is preferable that the octagon pattern of the metal silicide layer 18 is a regular octagon.

As described above, it is possible to realize the JBS having high forward surge resistance and excellent reverse leakage current characteristics according to the embodiment. In addition, the JBS with stable characteristics can be realized.

Although the case of 4H-SiC has been exemplified as SiC in the embodiment, but other crystal forms such as 3C-SiC and 6H-SiC can be used.

Further, the description has been given by exemplifying the case where the first plane P1 is the plane inclined by 0° to 8° with respect to the (0001) face and the second plane P2 is the plane inclined by 0° to 8° with respect to the (000-1) face in the embodiment, but it is also possible to use other plane orientations.

Further, the description has been given with the example in which the first conductivity type is the n type and the second conductivity type is the p type in the embodiment, but the first conductivity type may be the p type and the second conductivity type may be the n type.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer having a first plane and a second plane facing the first plane;
   a first silicon carbide region of a first conductivity type provided in the silicon carbide layer;
   a second silicon carbide region of a second conductivity type provided between the first silicon carbide region and the first plane;
   a third silicon carbide region of the second conductivity type provided between the first silicon carbide region and the first plane, the third silicon carbide region extending in a first direction parallel to the first plane, the third silicon carbide region being connected to the second silicon carbide region, and the third silicon carbide region having a first width in a second direction, the second direction being parallel to the first plane and perpendicular to the first direction, the first width being narrower than a second width of the second silicon carbide region in the second direction;
   a first electrode provided on a side of the first plane of the silicon carbide layer and the first electrode being in contact with the first silicon carbide region;
   a second electrode provided on a side of the second plane of the silicon carbide layer; and
   a metal silicide layer provided between the first electrode and the second silicon carbide region, the metal silicide layer having a portion being in contact with the first plane, and a shape of the portion being an octagon.

2. The semiconductor device according to claim 1, wherein at least one side among eight sides of the octagon is parallel to the first direction.

3. The semiconductor device according to claim 1, further comprising a fourth silicon carbide region of the second conductive type provided between the second silicon carbide region and the metal silicide layer, and the fourth silicon carbide region having a second conductive type impurity concentration higher than a second conductive type impurity concentration of the second silicon carbide region.

4. The semiconductor device according to claim 1, wherein the metal silicide layer contains nickel silicide or titanium silicide.

5. The semiconductor device according to claim 1, wherein the first conductivity type is an n type and the second conductivity type is a p type.

6. The semiconductor device according to claim 1, further comprising a fifth silicon carbide region of the first conductivity type provided between the first silicon carbide region and the second plane, and the fifth silicon carbide region having a first conductivity type impurity concentration higher than a first conductivity type impurity concentration of the first silicon carbide region.

7. The semiconductor device according to claim 1, wherein a first conductivity type impurity concentration of the first silicon carbide region is $1\times10^{14}$ cm$^{-3}$ or higher and $2\times10^{16}$ cm$^{-3}$ or lower.

8. The semiconductor device according to claim 1, wherein a second conductivity type impurity concentration of the second silicon carbide region is $1\times10^{14}$ cm$^{-3}$ or higher and $5\times10^{18}$ cm$^{-3}$ or lower.

9. The semiconductor device according to claim 1, wherein a second conductivity type impurity concentration of the third silicon carbide region is $5\times10^{16}$ cm$^{-3}$ or higher and $5\times10^{18}$ cm$^{-3}$ or lower.

10. The semiconductor device according to claim 1, wherein a second conductivity type impurity concentration of the fourth silicon carbide region is $1\times10^{19}$ cm$^{-3}$ or higher and $1\times10^{21}$ cm$^{-3}$ or lower.

* * * * *